(12) United States Patent
Shroff et al.

(10) Patent No.: US 9,685,405 B2
(45) Date of Patent: Jun. 20, 2017

(54) FUSE/RESISTOR UTILIZING INTERCONNECT AND VIAS AND METHOD OF MAKING

(71) Applicants: Mehul D. Shroff, Austin, TX (US); Douglas M. Reber, Austin, TX (US); Edward O. Travis, Austin, TX (US)

(72) Inventors: Mehul D. Shroff, Austin, TX (US); Douglas M. Reber, Austin, TX (US); Edward O. Travis, Austin, TX (US)

(73) Assignee: NXP USA, INC., Austin, TX (US)

( * ) Notice: Subject to any disclaimer, the term of this patent is extended or adjusted under 35 U.S.C. 154(b) by 414 days.

(21) Appl. No.: 13/907,497

(22) Filed: May 31, 2013

(65) Prior Publication Data

US 2014/0353797 A1    Dec. 4, 2014

(51) Int. Cl.
*H01L 23/525* (2006.01)
*H01L 23/522* (2006.01)
*H01L 49/02* (2006.01)

(52) U.S. Cl.
CPC ...... *H01L 23/5256* (2013.01); *H01L 23/5228* (2013.01); *H01L 28/20* (2013.01); *H01L 2924/0002* (2013.01)

(58) Field of Classification Search
CPC . H01L 23/5256; H01L 23/5228; H01L 28/20; H01L 2924/0002; H01L 2924/00

USPC .................................................. 438/382, 627
See application file for complete search history.

(56) References Cited

U.S. PATENT DOCUMENTS

| | | | | |
|---|---|---|---|---|
| 5,311,061 A | * | 5/1994 | Sheck ................... | H01L 23/544 257/758 |
| 5,712,206 A | * | 1/1998 | Chen ..................... | H01L 23/291 148/DIG. 55 |
| 6,184,121 B1 | * | 2/2001 | Buchwalter ......... | H01L 21/7682 257/522 |
| 6,897,136 B2 | | 5/2005 | Bae | |
| 8,174,091 B2 | | 5/2012 | Thei et al. | |
| 2003/0119293 A1 | * | 6/2003 | Bae ..................... | H01L 23/5258 438/601 |

* cited by examiner

*Primary Examiner* — Hrayr A Sayadian

(57) ABSTRACT

A semiconductor structure comprising a fuse/resistor structure over a functional layer having a substrate. The fuse/resistor structure includes a via, a first interconnect layer, and a second interconnect layer. The via is over the functional layer and has a first end and a second end vertically opposite the first end, wherein the first end is bounded by a first edge and a second edge opposite the first edge and the second end is bounded by a third edge and a fourth edge opposite the third edge. The first interconnect layer includes a first metal layer running horizontally and contacting the first end and completely extending from the first edge to the second edge. The second interconnect layer includes a second metal layer running horizontally and contacting the second end of the via and extending past the third edge but reaching less than half way to the fourth edge.

4 Claims, 8 Drawing Sheets

FUSE/RESISTOR UTILIZING INTERCONNECT AND VIAS AND METHOD OF MAKING

BACKGROUND

Field

This disclosure relates generally to fuses in semiconductor devices, and more specifically, to fuses and resistors using interconnect layers and vias.

Related Art

Fuses are commonly used in semiconductor manufacturing and often require significant space. Blowing the fuses is generally an issue and is commonly done with lasers. One of the issues with fuses is that the fuse must be tested in a separate context from the context in which they are blown. Also the blowing occurs prior to packaging. Thus the process is time consuming and even after the effort of the selective blowing of the fuses, there is a delay time from when the fuse can be tested. Also, the laser may cause the spread of conductive material on top of the integrated circuit which may cause a problem with the operation of the integrated circuit. An alternative is to use electrical circuits onboard the semiconductor chip to perform the blowing. This requires current and the current can be quite large. In a particular situation, the process may be such that the fuse cannot be blown. The fuse must not be so conductive relative to the surrounding conductive material as to result in the heat not being sufficiently focused on the fuse to effectively blow the fuse. Also resistors provide difficulties. Controlling the resistance of a resistor has long been an issue with semiconductor manufacturing. This can especially be true for resistors at the relatively high and relatively low resistance values. For example, for low resistance values, metal is used and long lengths may be used to provide some control by providing some increase in resistance. Height and width are typically dictated by the particular technology being used. Thus providing various increments of resistance can be challenging without using length as the variable, which requires significant space.

Accordingly there is a need to provide a fuse that can be made as part of an integrated circuit that improves upon one or more of the issues raised above.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, a fuse is made by misaligning either the top or the bottom of a via to a conductive line. The reduced area of contact at the point of misalignment increases the resistance at that point. For a given current magnitude in a current path, the heat ($I^2R$) increases linearly with an increase in resistance at any point in the path. Vias tend to be relatively more resistive than a regular metal layer due, at least in part, to the use of a barrier metal. Accordingly the heat is significantly higher at the point of misalignment than anywhere else in the current path used for blowing the fuse. This is better understood by reference to the drawings and the following written description.

The semiconductor substrate described herein can be any semiconductor material or combinations of materials, such as gallium arsenide, silicon germanium, silicon-on-insulator (SOI), silicon, monocrystalline silicon, the like, and combinations of the above.

Figure 1:
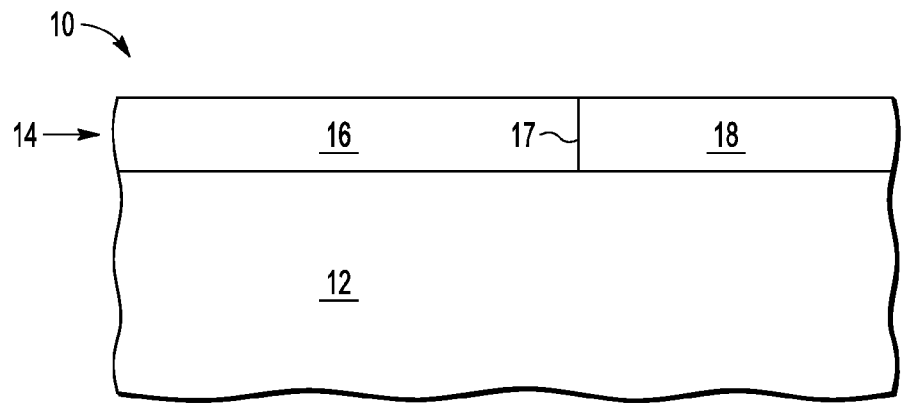
FIG. 1 is a cross section of a fuse structure at a stage in processing according to a first embodiment.

Shown in FIG. 1 is a semiconductor structure 10 comprising an underlying layer that includes a semiconductor substrate, transistor structures, and an insulating layer that may simply be referenced as functional layer 12. Functional layer 12 may also include one or more interconnect layers. Semiconductor structure 10 further includes an interconnect layer 14 over functional layer 12 having a metal layer 16 and an insulating layer 18 adjoining conductive layer 16 at a junction 17. Junction 17 may also be called an interface. Metal layer 16 may be a copper layer overlying a relatively thin barrier layer. A portion of the barrier layer may extend to be at junction 17 as well. The thickness of metal layer 16 may conveniently be the thickness of metal layers present in interconnect layers of the particular processing technology being used. Insulating layer 18 may be deposited oxide and may be formed after or at the same time as an upper portion of functional layer 12 is formed. The particular portion of semiconductor structure 10 shown in FIG. 1 may be referenced as fuse structure 10. Using typical orientation of a semiconductor substrate and corresponding interconnect layer 14, metal layer 16 may be considered to run horizontally. The manufacturing process builds the various layers vertically. The metal layers, such as metal layer 16, can be a stack of metal layers. Similarly, insulating layers, such as insulating layer 18, can be a stack of different insulating materials such as oxide and low-k materials. Junction 17 is shown as being at a 90 degree angle but it could be a different angle.

Figure 2:
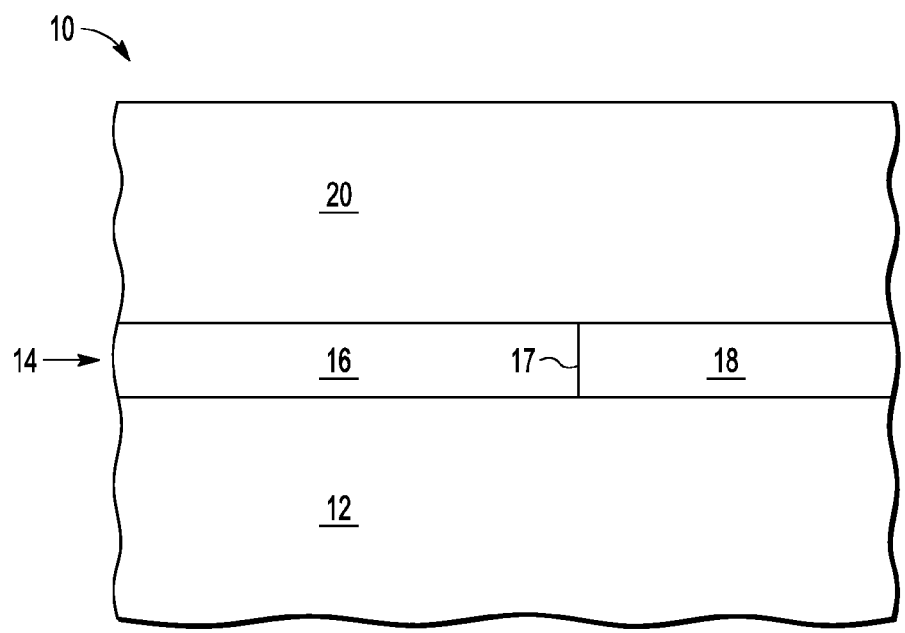
FIG. 2 is a cross section of the fuse structure of FIG. 1 at a subsequent stage in processing.

Shown in FIG. 2 is fuse structure 10 after forming an interlayer dielectric (ILD) 20 over metal layer 16, junction 17, and insulating layer 18. Interlayer dielectric 20 may be deposited oxide and could be made of multiple deposited layers that may or may not be oxide.

Figure 3:
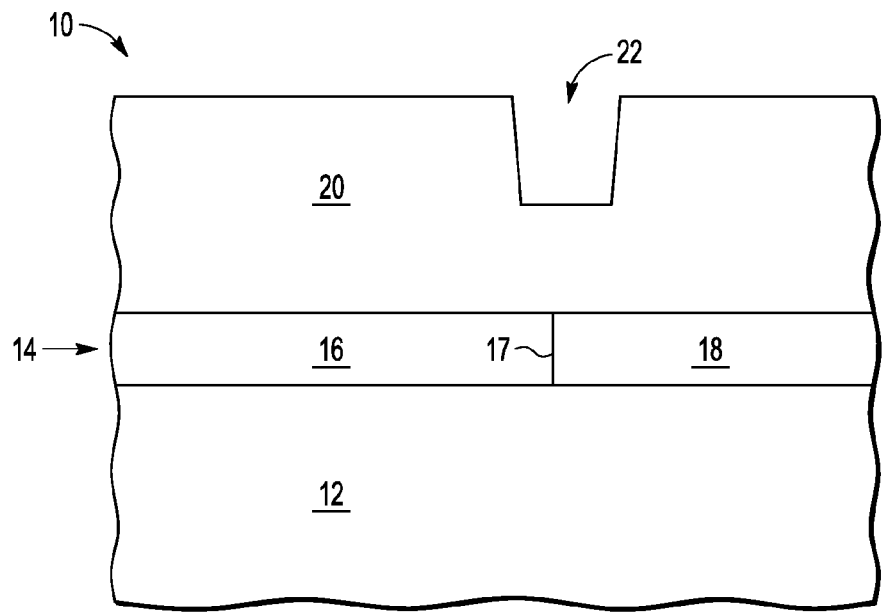
FIG. 3 is a cross section of the fuse structure of FIG. 2 at a subsequent stage in processing.

Shown in FIG. 3 is fuse structure 10 after forming an opening 22 formed about half way through ILD 20 where there may be an etch stop layer to define the depth of opening 22. Opening 22 is over junction 17 so that a portion of opening 22 is over a portion of metal layer 16 at junction 17 and a portion of opening 22 is over insulating layer at junction 17. More of opening 22 is over insulating layer 18 than is over metal layer 16.

Figure 4:
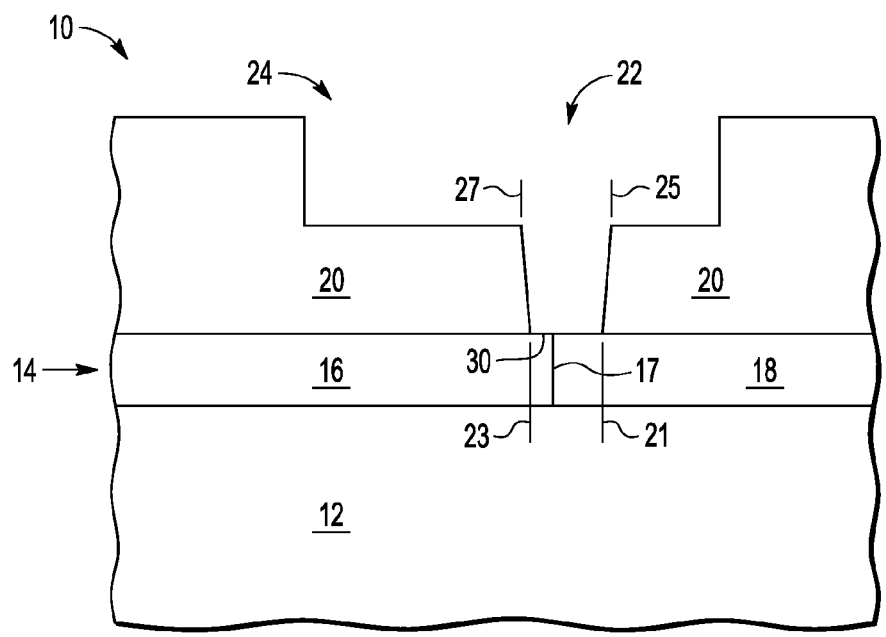
FIG. 4 is a cross section of the fuse structure of FIG. 3 at a subsequent stage in processing.

Shown in FIG. 4 is fuse structure 10 after forming a trench 24 in an area around opening 22 and extending opening 22 to metal layer 16, junction 17, and insulating layer 18. This is achieved with a single mask that results in the area of opening 24 being exposed, which includes exposing opening 22, so that opening 22 is extended to interconnect layer 14 during the creation of opening 24 by the etch. The amount of metal layer 16 that is exposed, shown as exposed portion 30, resulting from the etch is less than the amount of insulating layer 18 that is exposed. In effect, opening 22 is moved downward by this etch to open interconnect layer 14, which simultaneously moves the top surface around opening 22 downward while also moving the bottom of opening 22 downward to interlayer 14. As shown in FIG. 4, opening 22 has an upper edge 27, an upper edge 25, a lower edge 23, and a lower edge 21. Upper edges 27 and 25 are opposite each other in that a line from edge 27 to edge 25 will cross the center of opening 22. Similarly, lower edges 23 and 21 are opposite each other in that a line from edge 23 to edge 21 will cross through the center of opening 22. Opening 22 may be round both at the top and at the bottom, or a rectangle or square with rounded corners. The cross sections can be considered as passing through the center of opening 22. Thus, if opening 22 is circular, then edges 25 and 27 define an upper diameter and edges 21 and 23 define a lower diameter, and it is still clear that more of opening 22 is over insulating layer 18 than over metal layer 16.

In an alternate embodiment, opening 22 may be first etched all the way down to interconnect layer 14, stopping at an etch stop layer at the bottom of interlayer dielectric 20, and following the formation of opening 22, the remaining etch stop layer within opening 22 may be removed.

Figure 5:
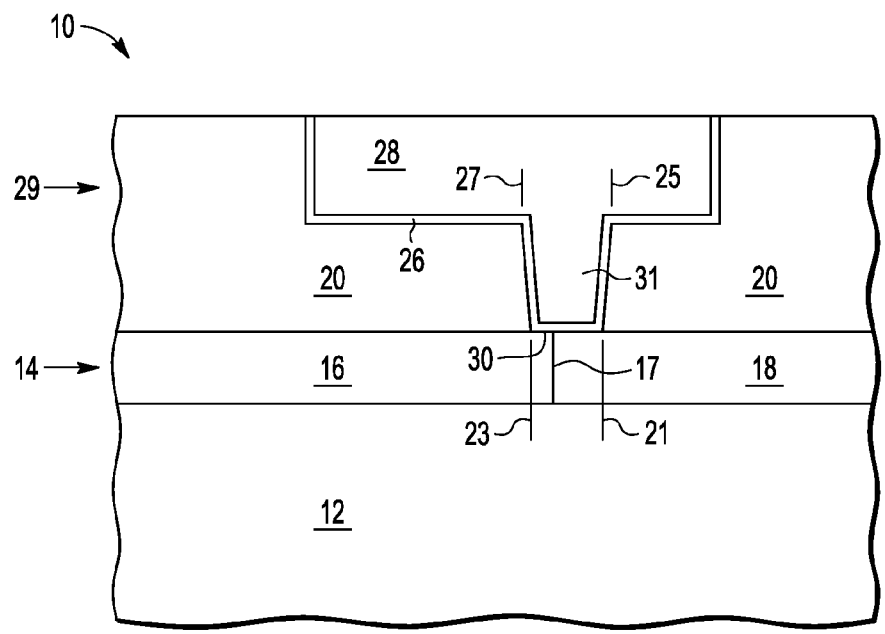
FIG. 5 is a cross section of the fuse structure of FIG. 4 at a subsequent stage in processing.

Shown in FIG. 5 is fuse structure 10 after depositing a barrier layer 26 and a thicker metal layer 28 and performing chemical mechanical polishing (CMP) to remove the metal and the barrier material from around opening 24 to leave a planar top surface. Barrier layer 26 directly contacts exposed portion 30 of metal layer 16, and metal layer 28 completes filling opening 24 and thus opening 22. Filled opening 22 along with the portion of barrier layer 26 in opening 22 forms a via 31 that then has the same edges as opening 22 of in FIG. 4 or substantially so. The top surface of ILD 20 may be lowered slightly due to the CMP. The result is that via 31 has an upper end between upper edges 27 and 25 and a lower end between lower edges 23 and 21 and that metal layer 16 extends less than halfway across the lower surface of via 31. Metal layer 16 extends past edge 23 but less than halfway to edge 21. Copper has been found to be effective for the primary interconnect material such as would be used for metal layer 16 and for filling opening 22 and forming via 31 but another metal type may be found to be effective as well for interconnect and filling opening 22. Only the portion of the bottom of via 31 that contacts metal layer 16 is the portion of via 31 that provides a conductive path to the region above exposed portion 30. A majority of the bottom of via 31 contacts insulating layer 18. Via 31 then is a via that has a higher resistance than is considered desirable for a via due to not being aligned in a manner that results in fully contacting metal. Instead via 31 is intentionally misaligned so that only a portion of the contact area of the via, which is the bottom of the via, contacts metal layer 16 and the remaining portion contacts an insulating layer, insulating layer 18. This allows for a convenient high resistance spot in a circuit which can be hotter than any other spot in the circuit and thus more easily be intentionally damaged while keeping the rest of the circuit safe from harm. The portions of metal layer 28 and barrier layer 26 that are not part of via 31 can be considered as a part of an interconnect layer 29 that also includes an upper portion of ILD 20. The upper portion of ILD 20 separates metal layers that are formed at the same time as metal layer 28. As an alternative to forming via 31 and the overlying metal layer at the same time, via 31 may be formed, an insulating layer deposited and patterned with openings, and filled with metal layers. In either case, there is a metal layer over a via that fully extends over the top end of the via.

Fuse structure 10 as shown in FIG. 5 may similarly be formed using a process that reverses the sequence of etching the trench opening and the via opening. In such a case, a trench analogous to trench 24 in FIG. 4 would be performed, then an etch similar to the etch that forms opening 22 in FIG. 3 would be performed at the top surface of the trench instead of the top surface of ILD 20. This reversal of the sequence would still result in the structure of FIG. 4. Thus the subsequent process for completing the fuse structure 10 of FIG. 5 could still be used.

A fuse structure similar to FIG. 5 can also be achieved by simply forming the misaligned via to the underlying junction such as junction 17, depositing an overlying metal layer on the via, etching the overlying metal layer to achieve the desired connectivity, and then forming an insulating layer around and over the patterned overlying metal layer. This approach would likely use aluminum as the overlying metal layer and tungsten as the via material.

Fuse structure 10 of FIG. 5 shows a completed fuse prior to selective blowing. This structure shows metal layer 28 extending horizontally completely across via 31 from edge 27 to edge 25 and beyond edge 25. Metal layer 16, on the other hand, extends past lower edge 23 but less than halfway across via 31 and does not reach edge 21. The fuse as shown provides a relatively low resistance between metal layer 28 and metal layer 16 and will remain that way in the event the fuse is selected to be not blown. On the other hand, if the fuse is selected for blowing, the result will be a relatively high resistance between metal layer 28 and metal layer 16.

Figure 6:
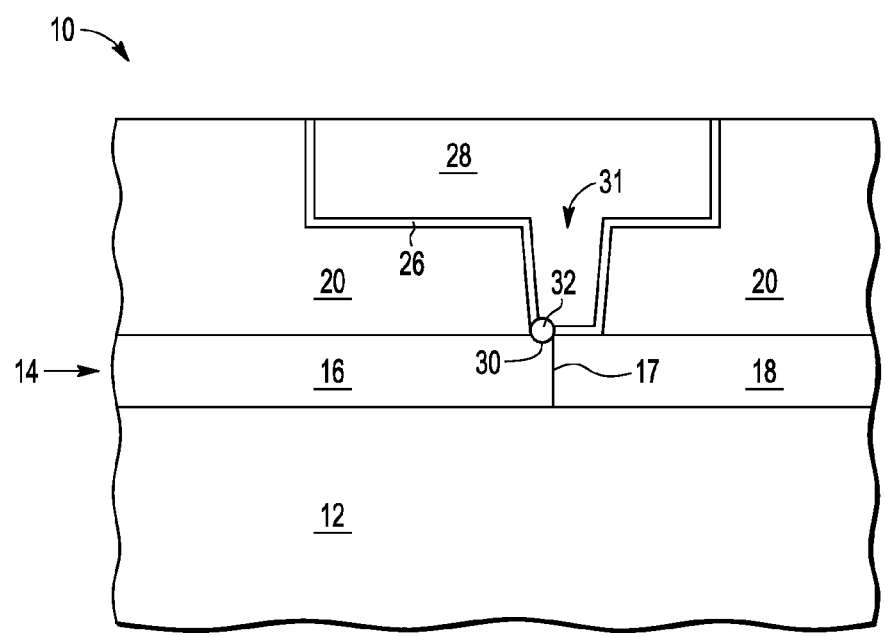
FIG. 6 is a cross section of the fuse structure of FIG. 5 at a subsequent stage in processing.

Shown in FIG. 6 is fuse structure 10 after creating a void 32 between via 31 and metal layer 16 by applying current of sufficient magnitude to cause the void. The magnitude of current is sufficient to create void 32 but kept low enough to avoid damaging other parts of the circuit that would be used to generate the current. For example, the magnitude of current that would damage a normal via would be easily determined and the current would be something less than that to have proper margin of safety. As void 32 begins to form, the resistance will begin to increase. With proper circuit control, the current magnitude can be maintained which will cause the area around void 32 to become sufficiently hotter because of the resistance increase with the current remaining the same. This will speed up the process of void 32 becoming sufficiently large to cause an open circuit. Detection that void 32 has been sufficiently formed is easily performed by detecting that the current used to form void 32 has become virtually non-existent after the void has formed, which can easily be detected. Void 32 is formed mostly where barrier layer 26 was in contact with exposed portion 30 of metal layer 16. This is convenient as well because the materials used for barriers are typically not as conductive as copper. Examples of a barrier material include titanium, tantalum, titanium nitride, and tantalum nitride, and furthermore, the barrier layer may comprise of combinations of such materials, for example, tantalum and tantalum nitride.

Thus it is seen that an intentionally misaligned via can be used as a fuse. FIGS. 1-6 show an approach by which the misalignment is to a conductive layer below the via. The FIGS. 7-14 show and the following description describe how the misalignment can be to a conductive layer overlying the via to achieve a fuse.

Figure 7:
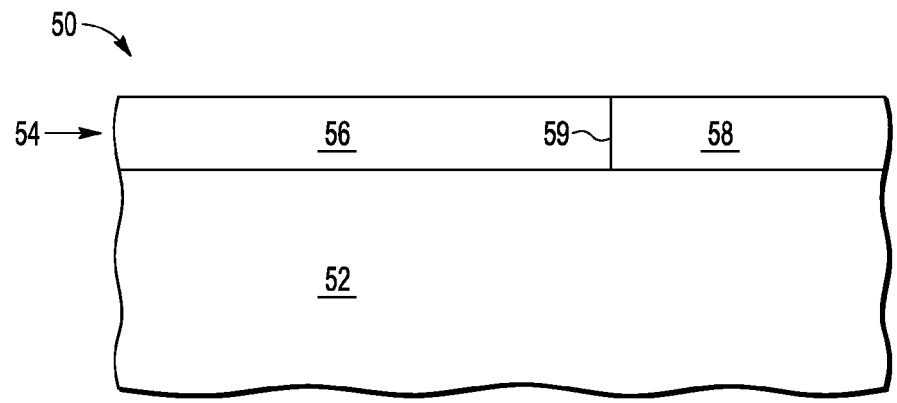
FIG. 7 is a cross section of a fuse structure at a stage in processing according to a second embodiment.

Shown in FIG. 7 is a semiconductor structure 50, similar to semiconductor structure 10 of FIG. 1, with a functional layer 52, an overlying interconnect layer 54 having a metal layer 56 and an insulating layer 58 adjoining metal layer 56 at a junction 59 which may also be called an interface. As in FIG. 1, not shown are many other conductive layers separated by insulating layer 58 that would be present in interconnect layer 54 and thus also similarly the particular portion of semiconductor structure shown in FIG. 7 may be referenced as fuse structure 50.

Figure 8:
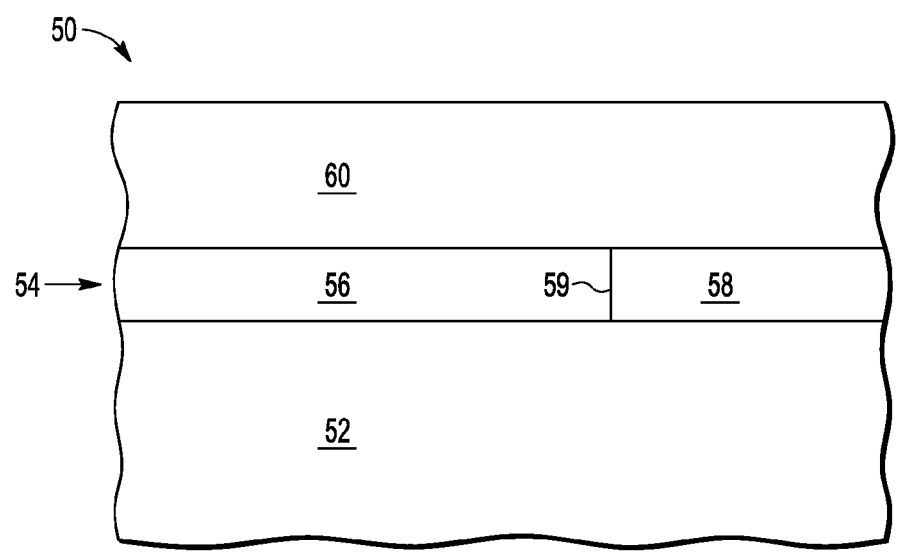
FIG. 8 is a cross section of the fuse structure of FIG. 7 at a subsequent stage in processing.

Shown in FIG. 8 is a fuse structure 50 after forming an ILD 60 over interconnect layer 54. In this case ILD 60 is shown as about twice the thickness of interconnect layer 54. FIG. 2 showed the ratio to be about three to one. This ratio depends on the particular process. Current technology is closer to two to one.

Figure 9:
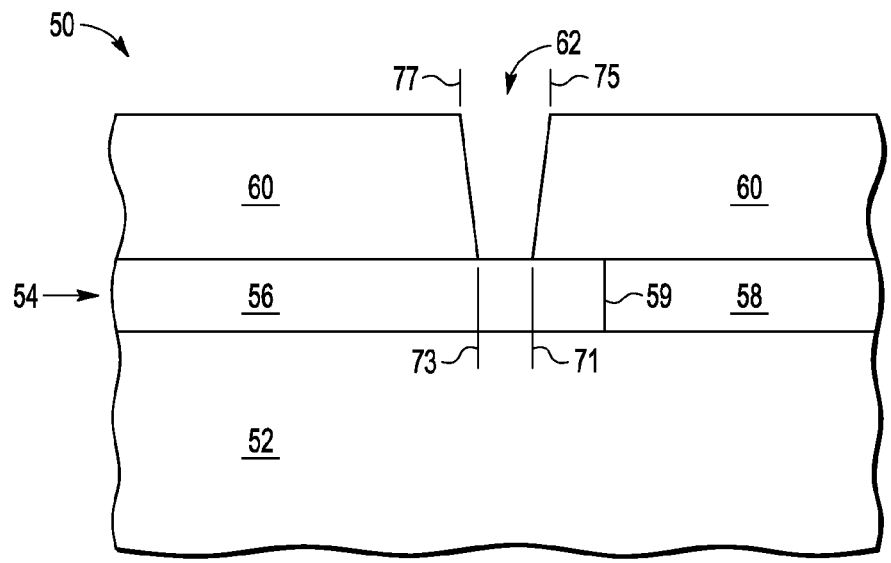
FIG. 9 is a cross section of the fuse structure of FIG. 8 at a subsequent stage in processing.

Shown in FIG. 9 is fuse structure 50 after forming an opening in ILD 60 to expose a portion of metal layer 56. In this case all of opening 62 is over metal layer 56 and does not overlap junction 59. Opening 62 has upper edges 75 and 77 that are opposite from each other at an upper end and lower edges 73 and 71 that are opposite from each other at a lower end. Opening 62, similar to opening 22 in FIG. 3, may be designed as being square or rectangular but may in fact be round or have rounded edges. In any case, the cross sections are through the center of the via so that in the case of opening 62 being circular, the cross section passes through the center of the circle.

Figure 10:
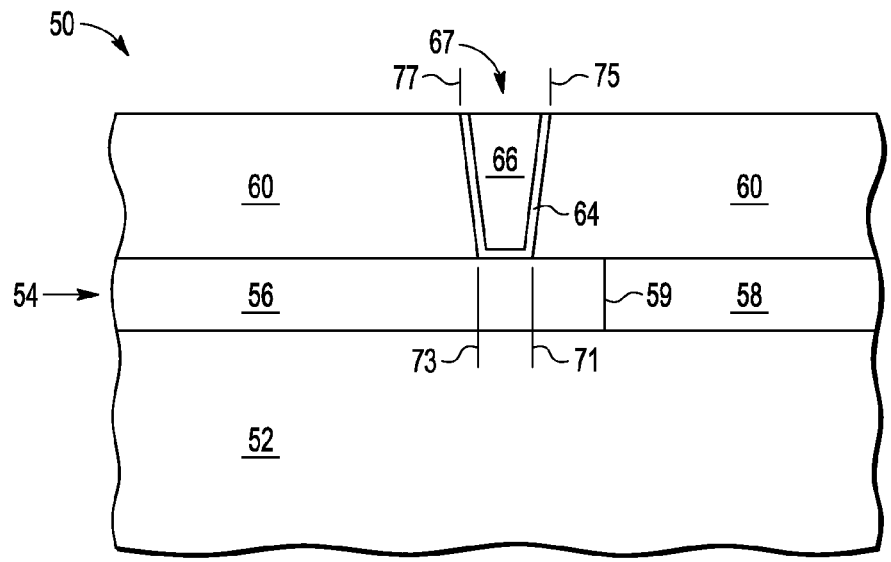
FIG. 10 is a cross section of the fuse structure of FIG. 9 at a subsequent stage in processing.

Shown in FIG. 10 is fuse structure 50 after lining opening 62 with a relatively thin barrier layer 64 and filling it with a copper fill 66 to form a via 67 of copper fill 66 and barrier layer 64. This is achieved by depositing a barrier material and then copper sufficient to fill opening 62 and then performing CMP so that no conductive material is on ILD 60 at this stage. Via 67, subsequent to filling opening 62, results in having the same opposite upper edges 75 and 77 at an upper end of via 67 and opposite lower ends 73 and 71 at a lower end of via 67. The upper end is in vertical relationship to the lower end.

Figure 11:
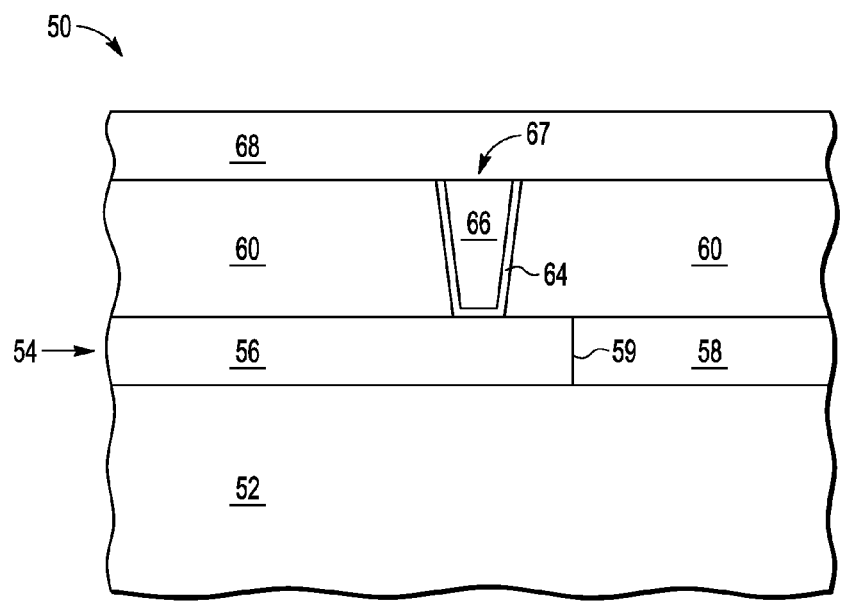
FIG. 11 is a cross section of the fuse structure of FIG. 10 at a subsequent stage in processing.

Shown in FIG. 11 is fuse structure 50 after forming an insulating layer 68 over insulating layer 60 and via 67. Layer 68 may be about the same thickness as interconnect layer 54.

Figure 12:
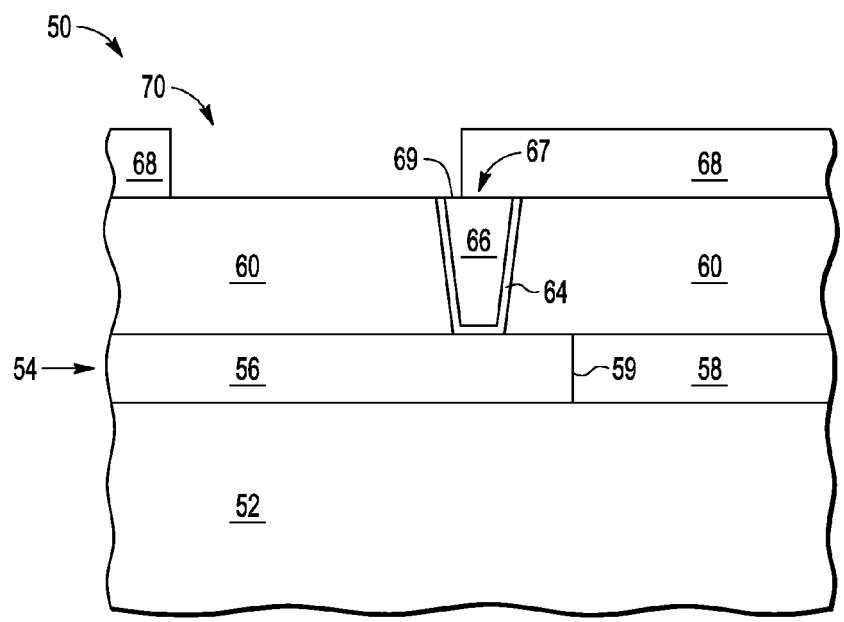
FIG. 12 is a cross section of the fuse structure of FIG. 11 at a subsequent stage in processing.

Shown in FIG. 12 is fuse structure 50 after forming an opening 70 in insulating layer 68 through to ILD 60 that results in an exposed portion 69 of a top portion of via 67 which includes a thickness of barrier layer 64 and a relatively small portion of the top surface of copper fill 66. Exposed portion 69 is significantly smaller in area than a bottom portion of via 67 that contacts metal layer 56.

Figure 13:
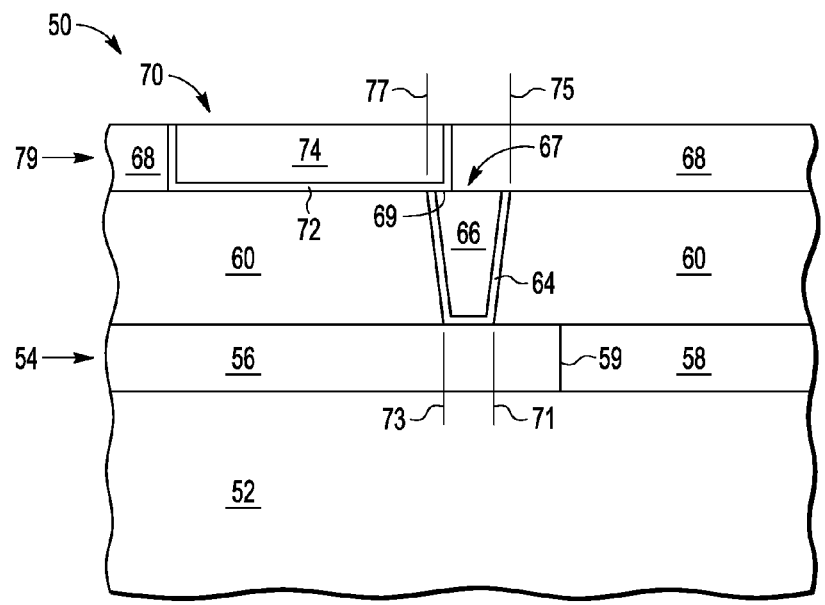
FIG. 13 is a cross section of the fuse structure of FIG. 12 at a subsequent stage in processing.

Shown in FIG. 13 is fuse structure 50 after forming a relatively thin barrier layer 72 in opening 70 and filling opening 70 with metal layer 74. This is achieved by forming barrier layer 72 followed by filling opening 70 with copper and then performing CMP to remove all of the conductive material from the top surface of insulating layer 68. The result is that metal layer 74 makes electrical contact to via 67 at exposed portion 69 only. In this case, insulating layer 68, metal layer 74, and barrier layer 72 form a portion of an interconnect layer 79. The combination of metal layer 74 and barrier layer 72 may be considered a metal layer. This result shown in FIG. 13 can also be achieved by first depositing an overlying metal layer, etching the overlying metal layer to achieve the desired misalignment with the via, and then forming the insulating layer around and over the etched overlying metal layer. This approach would likely use aluminum as the overlying metal layer and tungsten as the via material.

Fuse structure 50 of FIG. 13 shows a completed fuse prior to selective blowing. This structure shows metal layer 56 extending horizontally completely across via 67 from edge 73 to edge 71 and beyond edge 71. Metal layer 74 and barrier layer 72, on the other hand, extend past upper edge 77 but less than halfway across via 67 and do not reach edge 75. The fuse as shown provides a relatively low resistance between metal layer 74 and metal layer 56 and will remain that way in the event the fuse is selected to be not blown. On the other hand, if the fuse is selected for blowing, the result will be a relatively high resistance between metal layer 74 and metal layer 56.

Figure 14:
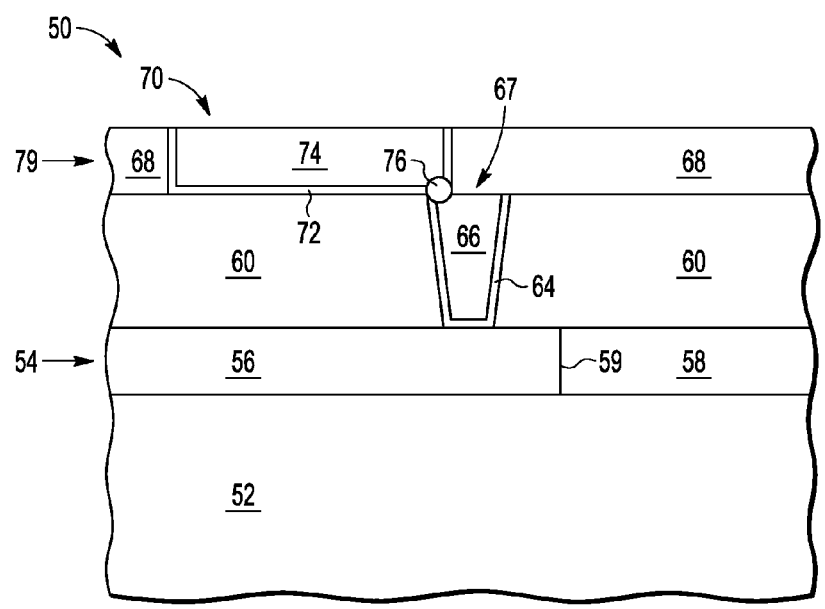
FIG. 14 is a cross section of the fuse structure of FIG. 13 at a subsequent stage in processing.

Shown in FIG. 14 is fuse structure 50, similar to fuse structure 10 in FIG. 6, after creating a void 76 between via 67 and metal layer 74 by applying current of sufficient magnitude to cause the void. The magnitude of current is sufficient to create void 76 but kept low enough to avoid damaging other parts of the circuit that would be used to generate the current. For example, the magnitude of current that would damage a normal via would be easily determined and the current would be something less than that to have proper margin of safety. As void 76 begins to form, the resistance will begin to increase. With proper circuit control, the current magnitude can be maintained which will cause the area around void 76 to become sufficiently hotter because of the resistance increase with the current remaining the same. This will speed up the process of void 76 becoming sufficiently large to cause an open circuit which can easily be detected. Void 76 is formed mostly where barrier layer 72 was in contact with exposed portion 69 of via 67. Detection that void 76 has been sufficiently formed is easily performed by detecting that the current used to form void 76 has become virtually non-existent after the void has formed. Although voltage may be increased to maintain the desired current, there would be a maximum voltage at which no further increase would be possible without damaging the semiconductor structure.

Figure 15:
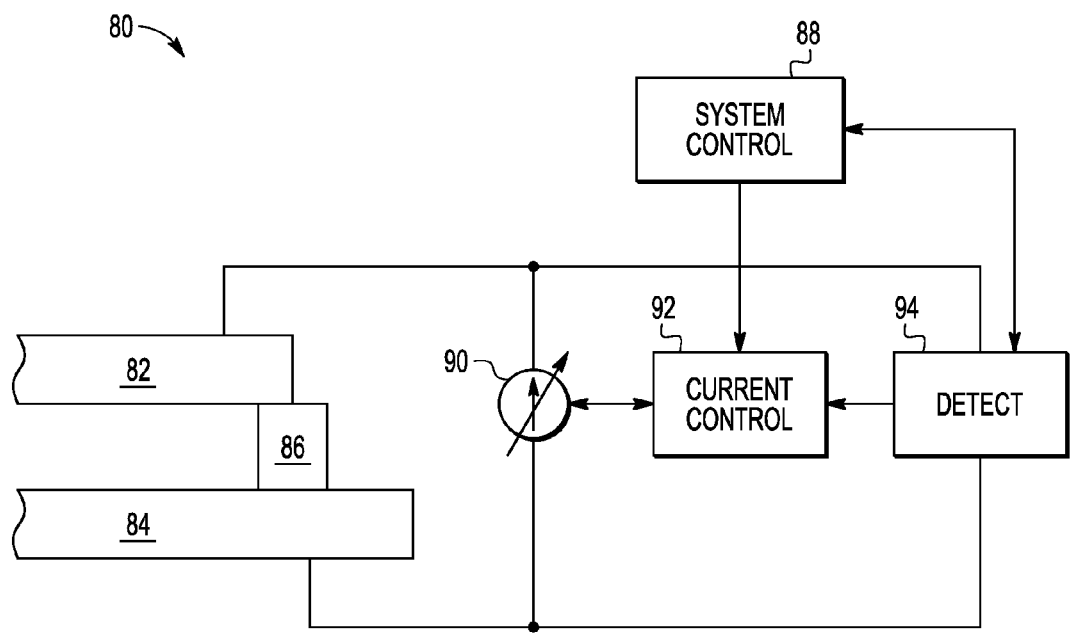
FIG. 15 is a combination block diagram and cross section of a fuse structure useful in showing how the fuse structures of FIGS. 1-14 may be blown.

Shown in FIG. 15 is a block diagram of a fuse system 80 for selectively blowing a fuse of the type described and shown in FIGS. 1-14. Fuse system 80 comprises a first conductor 82, a second conductor 84, a via 86 contacting conductors 82 and 84, a system control circuit 88, a variable current source 90 coupled to conductors 82 and 84, a current control circuit 92 coupled to variable current source 90, and a detect circuit 94 coupled to conductors 82 and 84, current control 92, and system control circuit 88. Conductor 82 partially extends across an end of via 86 in the same way as metal layers 74 and 16 partially extend over vias 67 and 31, respectively, which results in a fuse. System control circuit 88, variable current source 90, current control circuit 92, and detect circuit 94 are each made on the same integrated circuit as conductors 82 and 84 and via 86 and comprise a fuse control system. If the fuse is to be blown, it is blown by variable current source 90 supplying sufficient current to cause a void between conductor 82 and via 86. System control circuit 88 initiates this process by signaling current control circuit 92 to perform the blowing. Current control circuit 92 monitors the progress of the effect the current is having on the fuse and can adjust the current to avoid having excessive voltage and to determine when the blowing is complete. Detect circuit 94 may be used to aid in this process by monitoring the voltage for example. During system operation, system control circuit 88 may need to read the state of the fuse and signals detect circuit 94 for this information which then provides the information. Detect circuit 94 may store the information or may perform a detect operation on the fuse. Detect circuit 94 then provides the information to system control circuit 88. A system such as system 80 would likely have many fuses that would need to be able to be selectively blown and then have their states read.

So as shown and described a via can be misaligned to an underlying conductive layer, and, similarly, the via can be misaligned to an overlying conductive layer in order to achieve a fuse structure. These approaches are particularly beneficial in that they can use existing semiconductor processing techniques to achieve these fuse structures. In general, it is desirable for the misalignment to result in exposed portions 30 and 71 being as small as possible. The degree to which they are small is related to the alignment tolerance of the alignment tool, especially as it relates to the dimension of the via openings that are in the current path that is used to selectively blow the fuses. It is desirable that the via openings be the minimum for the particular semiconductor process being used but there may be some effectiveness if the via openings in the current path of the current used to blow the fuses are larger than the minimum.

As indicated previously, the fuse structure is a relatively high resistance via. The high resistance element in a given current path generates the most heat and thus is most susceptible to being selectively blown. Given that the intent is to provide increased resistance, the potential exists for the fuse structure to simply be used as a resistor. Using the fuse structures described in FIGS. 1-14 may be effective as a base increment of resistance and then putting them in parallel or series to achieve various relative resistances for relatively low resistance situations. Accordingly, the fuse structures may be referenced as a fuse/resistor structure and may be used as a fuse or a resistor.

By now it should be appreciated that there has been provided a semiconductor structure comprising a fuse/resistor structure over a functional layer having a substrate. The fuse/resistor structure includes a via over the functional layer having a first end and a second end vertically opposite the first end, wherein the first end is bounded by a first edge and a second edge opposite the first edge and the second end is bounded by a third edge and a fourth edge opposite the third edge. The fuse/resistor structure further includes a first interconnect layer comprising a first metal layer running horizontally and contacting the first end and completely extending from the first edge to the second edge. The fuse/resistor structure further includes a second interconnect layer comprising a second metal layer running horizontally and contacting the second end of the via and extending past the third edge but reaching less than half way to the fourth edge. The fuse structure may have a further characterization by which the via comprises a copper fill and a barrier layer, wherein the barrier layer contacts the second end of the via. The fuse structure may have a further characterization by which the first metal layer has a copper portion that is continuous with the copper fill. The fuse structure may have a further characterization by which the barrier layer of the via comprises one of a group consisting of tantalum and titanium. The fuse structure may have a further characterization by which the second metal layer comprises a copper layer and a barrier layer, wherein the barrier layer contacts the second end of the via. The fuse structure may have a further characterization by which the barrier layer contacts a top surface of the first metal layer. The fuse structure may have a further characterization by which the via comprises copper fill and a barrier layer. The fuse structure may have a further characterization by which the barrier layer contacts a top surface of the first metal layer. The fuse structure may further include a fuse control system that is electrically coupled to the first and second metal layers and controls blowing and reading of the fuse/resistor structure. The fuse structure may have a further characterization by which the fuse/resistor structure is blown when an open is formed between the second metal layer and the via. The fuse structure may have a further characterization by which the via comprises a copper fill and a barrier layer comprising one of a group consisting of tantalum and titanium between the copper fill and the second metal layer and the fuse/resistor structure is blown when the barrier layer is blown.

Disclosed also is a method of making a semiconductor structure comprising forming a fuse/resistor structure over a functional layer that includes a substrate. The forming the fuse/resistor structure comprises. The forming the fuse/resistor structure comprises forming a first metal layer bounded by a first insulating layer at a junction. The forming the fuse/resistor structure further includes forming a via having a bottom surface over the junction, wherein more of the bottom surface is in contact with the first insulating layer than is in contact with the first metal layer. The forming the fuse/resistor structure further includes forming a second metal layer over and in contact with a top area of the via. The forming the forming the via and the second metal layer may include forming an insulating layer over the first metal layer, forming a first opening partially through the insulating layer, forming a second opening surrounding the second opening partially through the insulating layer and extending the first opening to the junction, depositing a barrier layer in the first and second openings, and depositing a metal on the barrier layer in the first and second openings, whereby the via is formed in the first opening and the second metal layer is formed in the second opening and over the via. The method may have a further characterization by which the depositing a metal comprises depositing copper. The method may have a further characterization by which the depositing a barrier layer comprises depositing one of a group consisting of tantalum and titanium. Blowing the fuse/resistor structure formed by the method may be performed by applying current through the bottom surface of the via where the bottom surface is in contact with the first metal layer.

Also disclosed is a method of making a semiconductor structure comprising forming a fuse/resistor structure over a functional layer that includes a substrate. The forming the fuse/resistor structure includes forming a first metal layer. The forming the fuse/resistor structure further includes forming a via having a bottom surface in contact with the first metal layer and a top surface having a first area. The forming the fuse/resistor structure further includes forming a second metal layer after forming the via that extends to contact only a portion of the top surface of the via, wherein the portion is less than half the first area. The method may have a further characterization by which the forming the via is further characterized by the bottom surface having a second area that is smaller than the first area and the forming the second metal layer is further characterized by the portion being less than half the second area. The method may have a further characterization by which the forming the second metal layer comprises forming a barrier layer and forming a copper layer over the barrier layer. The method may have a further characterization by which the forming the via includes forming an interlayer dielectric over the first metal layer, forming an opening in the interlayer dielectric, depositing a barrier layer in the opening, depositing a metal fill over the barrier layer to fill the opening, and performing chemical mechanical polishing, whereby the via is formed in the opening. The method may further include forming an insulating layer over the interlayer dielectric and the via and forming an opening in the insulating layer that exposes the portion of the via, wherein the forming the first metal layer is further characterized by depositing a barrier layer and a copper layer into the opening in the insulating layer and performing chemical mechanical polishing.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, different materials than those described may be found to be effective. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of making a semiconductor structure comprising forming a fuse/resistor structure over a functional layer that includes a substrate, the method of forming the fuse/resistor structure comprising:
    forming a first metal layer bounded by a first insulating layer at a junction;
    forming an insulating layer over the first metal layer;
    forming a via having a bottom surface over the junction, wherein
        said forming the via comprises forming a first opening partially through the insulating layer, forming a second opening surrounding the first opening partially through the insulating layer and extending the first opening to the junction, depositing a barrier layer in the first and second openings, and depositing a metal on the barrier layer in the first opening, and
        more of the bottom surface of the via is in contact with the first insulating layer than is in contact with the first metal layer; and
    forming a second metal layer over and in contact with a top area of the via.

2. The method of claim 1, wherein the depositing a metal comprises depositing copper.

3. The method of claim 2, wherein the depositing a barrier layer comprises depositing one of a group consisting of tantalum and titanium.

4. Blowing the fuse/resistor structure formed by the method of claim 1 by applying current through the bottom surface of the via where the bottom surface is in contact with the first metal layer.

* * * * *